US012333706B2

(12) United States Patent
Baek

(10) Patent No.: US 12,333,706 B2
(45) Date of Patent: Jun. 17, 2025

(54) MASK INSPECTION APPARATUS AND METHOD FOR INSPECTING A MASK HAVING FIRST AND SECOND OPENINGS

(71) Applicant: Samsung Display Co., Ltd., Yongin-si (KR)

(72) Inventor: Dae Won Baek, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 725 days.

(21) Appl. No.: 17/360,837

(22) Filed: Jun. 28, 2021

(65) Prior Publication Data

US 2021/0407067 A1 Dec. 30, 2021

(30) Foreign Application Priority Data

Jun. 29, 2020 (KR) .................. 10-2020-0079076

(51) Int. Cl.
*G06T 7/00* (2017.01)
*C23C 14/04* (2006.01)
(Continued)

(52) U.S. Cl.
CPC ............ *G06T 7/001* (2013.01); *C23C 14/042* (2013.01); *G01N 21/95607* (2013.01);
(Continued)

(58) Field of Classification Search
CPC ............. G01N 2021/95676; G01N 21/95607; G06T 7/001; G06T 2207/30108; G06T 2207/30121; G06T 2207/30148; C23C 14/042; G03F 1/84; H10K 71/166; H10K 71/00
See application file for complete search history.

(56) References Cited

U.S. PATENT DOCUMENTS

| 4,870,693 | A | * | 9/1989 | Arai | ...................... G06T 7/001 382/144 |
| 5,046,113 | A | * | 9/1991 | Hoki | ..................... G01N 21/956 382/222 |
| 5,764,793 | A | | 6/1998 | Omae et al. | |
| 2001/0033683 | A1 | * | 10/2001 | Tanaka | ................... G06T 7/001 382/149 |

(Continued)

FOREIGN PATENT DOCUMENTS

| JP | 8-189898 A | 7/1996 |
| JP | 3104462 B2 | 10/2000 |

(Continued)

*Primary Examiner* — Michael P LaPage
(74) *Attorney, Agent, or Firm* — Womble Bond Dickinson (US) LLP

(57) ABSTRACT

A mask inspection method and a mask inspection apparatus for inspecting a deposition mask are provided. A mask inspection method includes: providing a deposition mask including a plurality of first openings and a plurality of second openings, each of the first openings having a shape in a plan view different from that of each of the second openings; designating a first group and a second group, each including at least one of the first openings and at least one of the second openings; comparing an image of the first group with an image of the second group; and determining whether the first group and the second group are defective, an arrangement of the first and second openings of the first group being the same as an arrangement of the first and second openings of the second group.

8 Claims, 13 Drawing Sheets

(51) Int. Cl.
*G01N 21/956* (2006.01)
*G03F 1/84* (2012.01)
(52) U.S. Cl.
CPC ..... *G03F 1/84* (2013.01); *G01N 2021/95676* (2013.01); *G06T 2207/30108* (2013.01); *G06T 2207/30121* (2013.01)

(56) References Cited

U.S. PATENT DOCUMENTS

| | | | | |
|---|---|---|---|---|
| 2003/0044059 | A1* | 3/2003 | Chang | G03F 1/36 430/5 |
| 2003/0073010 | A1* | 4/2003 | Narukawa | G03F 1/84 430/5 |
| 2008/0195995 | A1* | 8/2008 | Kumar | G03F 1/36 716/50 |
| 2008/0282218 | A1* | 11/2008 | Lee | G03F 1/36 716/55 |
| 2009/0055794 | A1* | 2/2009 | Kimoto | G06F 30/39 716/55 |
| 2009/0091701 | A1* | 4/2009 | Kondo | G02F 1/1339 349/153 |
| 2009/0206252 | A1* | 8/2009 | Okazaki | G06T 7/001 250/306 |
| 2009/0232385 | A1* | 9/2009 | Matsuoka | G06T 7/12 382/199 |
| 2009/0303323 | A1* | 12/2009 | Yoshikawa | G06T 7/001 348/92 |
| 2012/0051621 | A1* | 3/2012 | Ong | G03F 1/84 382/144 |
| 2013/0119250 | A1* | 5/2013 | Hosoya | G06T 7/001 250/307 |
| 2014/0254914 | A1* | 9/2014 | Kim | G01N 21/9501 382/144 |
| 2015/0034005 | A1* | 2/2015 | Ko | C23C 14/042 118/504 |
| 2015/0164464 | A1* | 6/2015 | Mah | A61B 6/583 378/204 |
| 2015/0165464 | A1* | 6/2015 | Baek | B05C 21/005 118/504 |
| 2016/0093040 | A1* | 3/2016 | Sousa | G01N 21/95607 382/149 |
| 2016/0334208 | A1* | 11/2016 | Liou | G03F 7/70633 |
| 2018/0040857 | A1* | 2/2018 | Hong | C23C 14/042 |
| 2018/0063962 | A1* | 3/2018 | Lee | G02F 1/13452 |
| 2019/0043911 | A1* | 2/2019 | Honda | H01L 27/14667 |
| 2019/0147579 | A1* | 5/2019 | Fang | G06T 7/0004 348/80 |
| 2019/0179461 | A1* | 6/2019 | Baek | G06F 3/0446 |
| 2020/0235298 | A1* | 7/2020 | Nishi | C23C 14/042 |
| 2021/0231584 | A1* | 7/2021 | Leu | G06F 30/398 |
| 2021/0351249 | A1* | 11/2021 | Yang | H10K 59/122 |

FOREIGN PATENT DOCUMENTS

| | | |
|---|---|---|
| JP | 2009-042055 | 2/2009 |
| KR | 10-2007-0117184 | 12/2007 |
| KR | 10-2019-0087597 | 7/2019 |

* cited by examiner

MASK INSPECTION APPARATUS AND METHOD FOR INSPECTING A MASK HAVING FIRST AND SECOND OPENINGS

CROSS-REFERENCE TO RELATED APPLICATION

This application claims priority to and the benefit of Korean Patent Application No. 10-2020-0079076, filed on Jun. 29, 2020 in the Korean Intellectual Property Office, the entire content of which is herein incorporated by reference.

BACKGROUND

1. Field

Aspects of embodiments of the present disclosure relate to a mask inspection apparatus and a mask inspection method.

2. Description of the Related Art

Typically, an organic light emitting diode (OLED) display is attracting attention as a next generation flat panel display device due to its excellent luminance and viewing angle characteristics and, unlike a liquid crystal display device, no requirement of any separate light source. With the elimination of the necessity for any separate light source, the OLED display can be manufactured having a lightweight and thin design. The OLED display is also characterized by low power consumption, high luminance, high reaction rate, and the like.

The OLED display includes a plurality of organic light emitting diodes, each being composed of an anode, an organic light emitting layer, and a cathode. During a process of manufacturing the organic light emitting diodes, a deposition mask is disposed on a substrate, and an organic material is provided onto the substrate through openings formed in the deposition mask to form organic light emitting layers. With the advance of technologies, a display device has an increasing number of organic light emitting diodes to meet a high resolution requirement.

The increasing number of organic light emitting diodes means that the number of openings of the deposition mask for use in manufacturing the organic light emitting layers is increased. Such a deposition mask is formed with a material including a metal, and, due to manufacturing problems, it is possible that not all of the plurality of openings have accurate shapes as desired in a pattern. This may cause a defect in the deposition pattern. In order to avoid such a defect, the mask is inspected in advance.

SUMMARY

According to aspects of embodiments of the present disclosure, a mask inspection apparatus and method that are capable of inspecting a mask with openings of different shapes for any defect at one time are provided.

However, aspects of the present disclosure are not restricted to those set forth herein. The above and other aspects of the present disclosure will become more apparent to one of ordinary skill in the art to which the present disclosure pertains by referencing the detailed description of the present disclosure provided below.

According to one or more embodiments, a mask inspection method includes: providing a deposition mask including a plurality of first openings and a plurality of second openings, each of the first openings having a shape in a plan view different from that of each of the second openings; designating a first group and a second group, each including at least one of the first openings and at least one of the second openings; comparing an image of the first group with an image of the second group; and determining whether the first group and the second group are defective based on a result of comparing the image of the first group with the image of the second group, wherein an arrangement of the first and second openings of the first group is the same as an arrangement of the first and second openings of the second group.

According to one or more embodiments, a mask inspection method includes: providing a deposition mask including a plurality of first openings and a plurality of second openings, each of the first openings having a shape in a plan view different from that of each of the second openings; preparing a reference image including first openings of the plurality of first openings and second openings of the plurality of second openings; designating a plurality of groups, each comprising first openings of the plurality of first openings and second openings of the plurality of second openings; comparing an image of a group of the plurality of groups with the reference image; and determining whether the group is defective based on a result of comparing the image of the group with the reference image, wherein an arrangement of the first and second openings of the group is the same as an arrangement of the first and second openings of the reference image.

According to one or more embodiments, a mask inspection apparatus for inspecting a deposition mask including a plurality of first openings and a plurality of second openings each having a shape in a plan view different from that of each of the first openings includes: a supporting table configured to support the deposition mask; a vision unit spaced apart from the supporting table and configured to capture an image of the deposition mask; and a controller configured to determine whether the first and second openings are defective based on the image captured by the vision unit, wherein the controller designates a first group and a second group, each including at least one of the first openings and at least one of the second openings, and compares a first image obtained by imaging the first group with a second image obtained by imaging the second group.

The mask inspection apparatus and method according to embodiments are capable of inspecting a mask with openings of different shapes for any defect at one time.

However, aspects and effects of the present disclosure are not limited to the aforementioned aspects and effects, and various other aspects and effects are included in the present specification.

BRIEF DESCRIPTION OF THE DRAWINGS

The above and other aspects and features of the present disclosure will become more apparent by describing in further detail some example embodiments thereof with reference to the attached drawings, in which.

DETAILED DESCRIPTION

Figure 1:
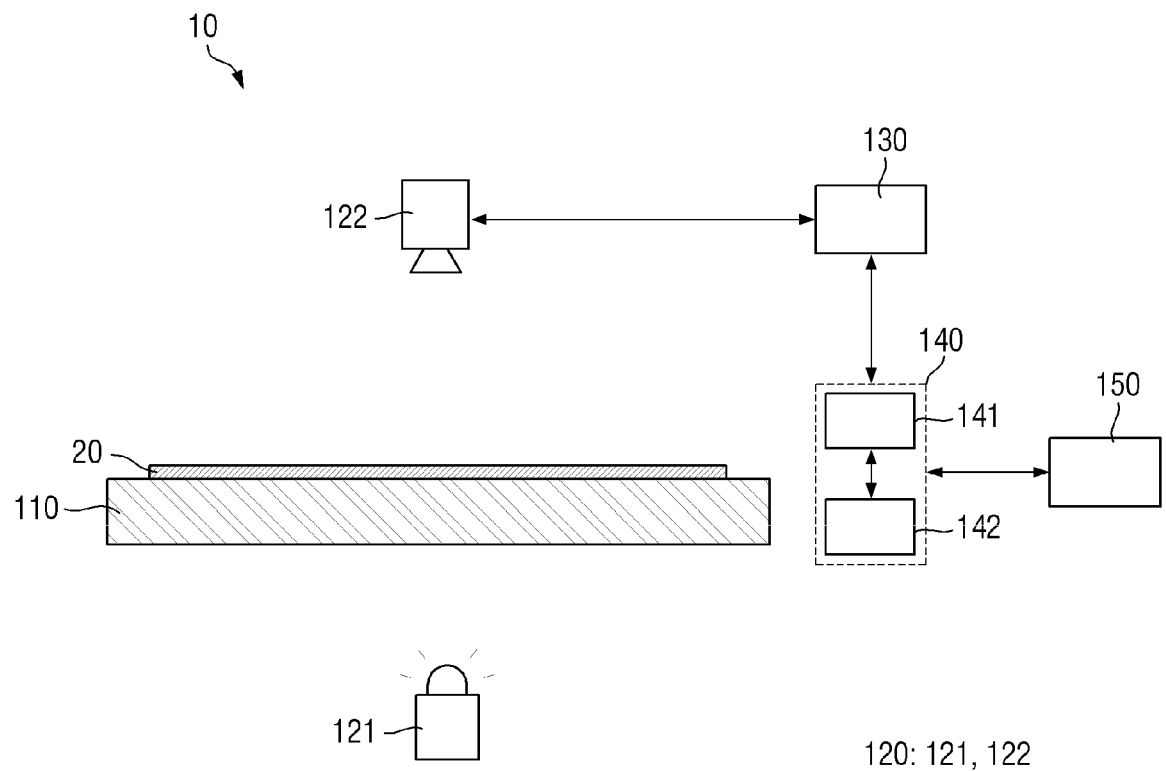
FIG. 1 is a side view schematically showing a mask inspection apparatus according to an embodiment.

The present invention will now be described more fully herein with reference to the accompanying drawings, in which some example embodiments of the invention are shown. The present invention may, however, be embodied in different forms and should not be construed as limited to the embodiments set forth herein. Rather, these embodiments are provided so that this disclosure will be thorough and complete, and will fully convey the scope of the invention to those skilled in the art.

It is to be understood that when a layer is referred to as being "on" another layer or substrate, it may be directly on the other layer or substrate, or one or more intervening layers may also be present. The same reference numbers indicate the same components throughout the specification. In the attached figures, the thicknesses of layers and regions may be exaggerated for clarity.

Although the terms "first," "second," etc. may be used herein to describe various elements, these elements should not be limited by these terms. These terms may be used to distinguish one element from another element. Thus, a first element discussed below may be termed a second element without departing from the teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

It is to be understood that when an element or layer is referred to as being "on," "connected to," "coupled to," or "adjacent to" another element or layer, it may be directly on, connected to, coupled to, or adjacent to the other element or layer, or one or more intervening elements or layers may be present. In contrast, when an element or layer is referred to as being "directly on," "directly connected to," "directly coupled to," or "immediately adjacent to" another element or layer, there are no intervening elements or layers present. As used herein, the terms "substantially," "about," and similar terms are used as terms of approximation and not as terms of degree, and are intended to account for the inherent deviations in measured or calculated values that would be recognized by those of ordinary skill in the art.

As used herein, phrases such as "a plan view" may refer to a view from top or from a direction normal to the display area of the display device.

Spatially relative terms, such as "beneath," "below," "lower," "above," "upper," "bottom," "top," and the like, may be used herein for ease of description to describe one element or feature's relationship to another element(s) or feature(s) as illustrated in the figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (e.g., rotated 90 degrees or at other orientations), and the spatially relative descriptors used herein should be interpreted accordingly.

Unless otherwise defined, all terms (including technical and scientific terms) used herein have the same meaning as commonly understood by one of ordinary skill in the art to which the present disclosure belongs. It is to be further understood that terms, such as those defined in commonly used dictionaries, should be interpreted as having a meaning that is consistent with their meaning in the context of the relevant art and/or the present disclosure, and should not be interpreted in an idealized or overly formal sense, unless expressly so defined herein.

Herein, some example embodiments will be described in further detail with reference to the accompanying drawings.

FIG. 1 is a side view schematically showing a mask inspection apparatus according to an embodiment.

Referring to FIG. 1, a mask inspection apparatus 10 according to an embodiment may include a supporting table 110, a vision unit 120, a data processing unit 130, a controller 140, and an output unit 150.

The supporting table 110 may provide a space in which a deposition mask 20 as an inspection target object can be placed. That is, the deposition mask 20 may be placed on the supporting table 110. The supporting table 110 may include a transparent glass or the like, allowing light emitted from a light irradiation member 121 to pass therethrough.

The supporting table 110 may fix the deposition mask 20 in a stretched state, although the present disclosure is not limited thereto. In this case, in an embodiment, the supporting table 110 may include clamps (not shown) for fixing both ends of the deposition mask 20 and a cylinder or gear and a motor for moving the clamps (not shown) linearly to stretch the deposition mask 20. The supporting table 110 may further include a mask frame (not shown) and, in this case, the deposition mask 20 may be attached to the mask frame (not shown), but the present disclosure is not limited thereto.

In an embodiment, although not shown in the drawing, the mask inspection apparatus 10 may further include a transfer member (not shown), and the supporting table 110 may be connected to the transfer member (not shown) and transferred by the transfer member (not shown).

The vision unit 120 may be arranged above and/or below the deposition mask 20 to capture an image of a surface shape of the deposition mask 20. The vision unit 120 may be spaced apart from the supporting table 110 and the deposition mask 20. The vision unit 120 may generate an image by imaging the deposition mask 20 and send the image to the controller 140. In an embodiment, the vision unit 120 may include the light irradiation member 121 and a light receiving member 122.

The light irradiation member 121 may be arranged below the supporting table 110 to emit light toward the supporting table 110. The light irradiation member 121 may emit the light towards the deposition mask 20 placed on the supporting table 110.

The light receiving member 122 may be arranged above the supporting table 110. The light receiving member 122 may face the light irradiation member 121 with the deposition mask 20 interposed therebetween. The light receiving member 122 may receive the light emitted from the light irradiation member 121 to capture an image of the deposition mask 20. That is, at least part of the light emitted from the light irradiation member 121 may pass through openings OP1 and OP2 (see FIGS. 2 and 3) of the deposition mask 20 and reach the light receiving member 122 such that the light receiving member 122 may take an image of the deposition mask 20.

The light receiving member 122 may include a charge-coupled device (CCD) sensor, although not limited thereto. In a case in which the light receiving member 122 includes a CCD sensor, the CCD sensor may be a two-dimensional sensor including an image capture area in which a number (e.g., a predetermined number) of pixels are arranged. For example, the CCD sensor may have an image capture area of 2048×512 pixels (144 μm×36 μm in a case in which one pixel is 70 nm×70 nm), although not limited thereto. That is, the CCD sensor may be composed of a plurality of row lines (e.g., 512 lines) arranged in a direction, each line being composed of a plurality of pixels (e.g., 2048 pixels).

The data processing unit 130 may process information of the image captured by the vision unit 120. The data processing unit 130 may convert the image information received from the vision unit 120 into a format fit for transmission and transmit the converted image information to the controller 140. In an embodiment, the data processing unit 130 may provide the controller 140 with necessary information in a wireline or wireless communication scheme.

The controller 140 may designate opening groups GR1 to GR6 (see FIGS. 2 and 7) including openings OP1 and OP2 of different shapes based on the data (image information) received from the data processing unit 130 and determine whether the deposition mask 20 is defective. The controller 140 may include a comparison unit 141 for comparison of the data (image information) and a determination unit 142 for determining presence/absence of any defect based on the comparison result.

Although not limited to the following, the method for the controller 140 to determine whether the deposition mask 20 is defective may, for example, include comparing the images obtained by imaging the same pattern at different locations (die-to-die comparison inspection method), or comparing an image obtained by imaging a pattern of an actual mask with a reference image generated based on plan data used in forming the deposition mask 20 (die-to-database comparison inspection method). The method for inspecting the deposition mask 20 is described later.

The controller 140 may take any of various forms. Although not limited to the following, the controller 140 may be provided, for example, in the form of a terminal, a personal computer, a laptop computer, or a PDA, which is installed separately, or in the form of a circuit board, which is installed internally with other components, rather than a separate device.

The output unit 150 may output information indicating whether the deposition mask 20 is defective as determined by the controller 140. The output unit 150 may output the information of the openings determined as normal and the openings determined as defective among the openings OP1 and OP2 (see FIGS. 2 and 3) of the deposition mask 20. The information of the output unit 150 may include coordinates information indicative of the locations of the openings determined as defective among the openings OP1 and OP2 (see FIGS. 2 and 3) of the deposition mask 20. Accordingly, a user may selectively correct the defective openings into the normal openings or, in a case in which a number of defective openings is equal to or greater than a certain number (e.g., a predetermined number), replace the deposition mask 20 with a new one and proceed to perform the deposition process.

The deposition mask 20 may include two or more openings OP1 and OP2 that differ in shape in a plan view. The deposition mask 20 is described in further detail with reference to FIGS. 2 and 3.

Figure 2:
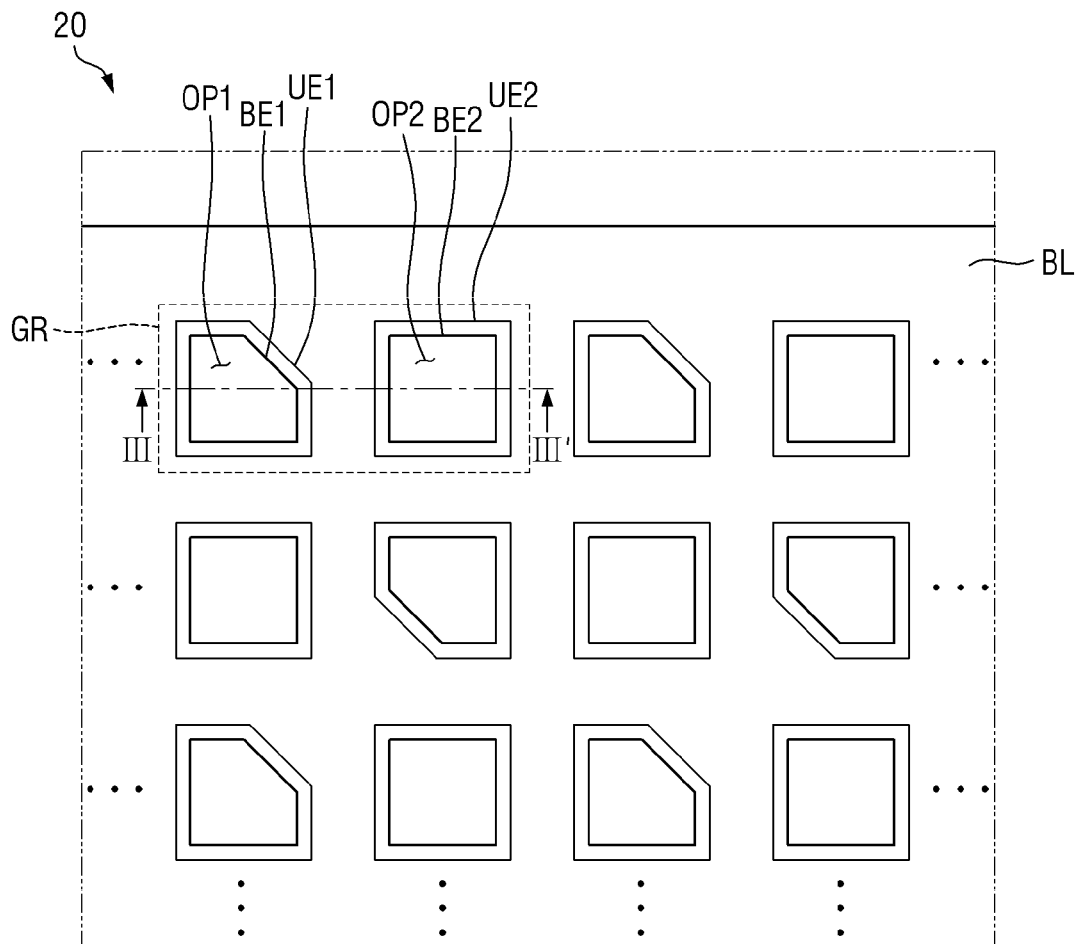
FIG. 2 is an enlarged plan view of a partial area of a mask.
Figure 2:
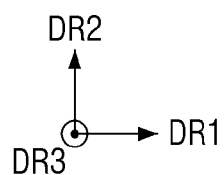
Figure 3:
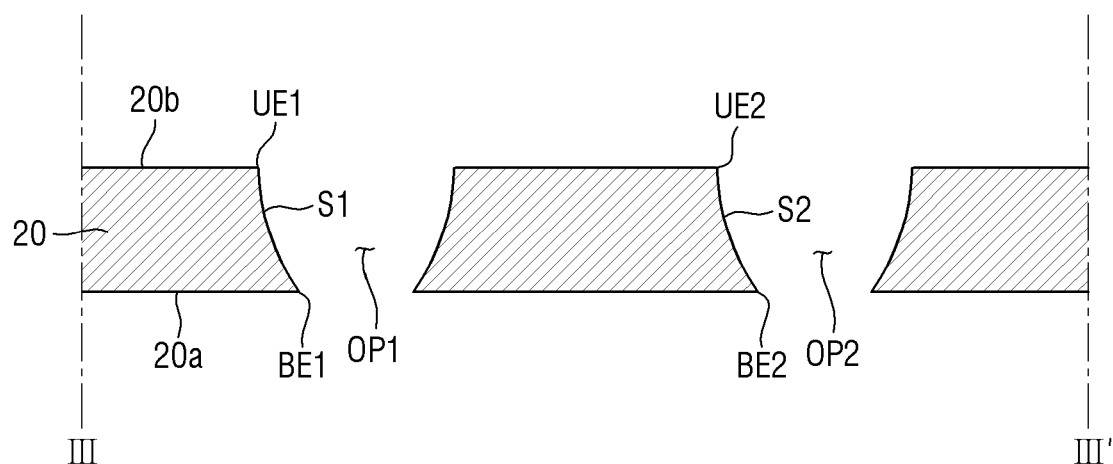
FIG. 3 is a cross-sectional view taken along the line III-III' of FIG. 2.
Figure 3:
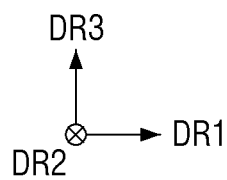

FIG. 2 is an enlarged plan view of a partial area of a mask; and FIG. 3 is a cross-sectional view taken along the line III-III' of FIG. 2.

Referring to FIGS. 2 and 3, in the drawings, a first direction DR1 indicates a horizontal direction of the deposition mask 20 in a plan view, and a second direction DR2 indicates a vertical direction of the deposition mask 20 in a plan view. Further, a third direction DR3 indicates a thickness direction of the deposition mask 20. The first direction DR1 and the second direction DR2 perpendicularly intersect each other. The third direction DR3 is a direction intersecting a plane on which the first direction DR1 and the second direction DR2 are located, and perpendicularly intersects both the first direction DR1 and the second direction DR2. It should be understood, however, that a direction mentioned in an embodiment refers to a relative direction and the embodiment is not limited to the direction mentioned.

The deposition mask 20 includes a blocking portion BL and a plurality of openings OP1 and OP2 formed inside the blocking portion BL. The blocking portion BL may block permeation of a deposition material. The blocking portion BL may include a blocking member. The blocking member may include a metal, such as any of nickel (Ni), a nickel alloy, and a nickel-cobalt alloy, for example. The blocking member may be provided in the form of a thin metal film, but is not limited thereto.

The openings OP1 and OP2 are formed inside the blocking portion BL, in a shape of penetrating a material layer constituting the blocking portion BL in the thickness direction (third direction DR3). The openings OP1 and OP2 allow the deposition material to pass therethrough such that a pattern having a shape corresponding to the openings OP1 and OP2 may be formed on a target substrate 330 (see FIG. 4).

The deposition mask 20 may have a first surface 20a and a second surface 20b. The first and second surfaces 20a and 20b of the deposition mask 20 may be opposite surfaces. Although not limited to the following, for example, the first surface 20a of the deposition mask 20 may be a surface facing the target substrate 330 (see FIG. 4), and the second surface 20b opposite to the first surface 20a may be a surface facing a crucible.

The deposition mask 20 may further include a first inside surface S1 and a second inside surface S2. The first inside surface S1 may face the first opening OP1 in the blocking portion BL, and the second inside surface S2 may face the second opening OP2 in the blocking portion BL. That is, the inner wall of the first opening OP1 may include the first inside surface S1, and the inner wall of the second opening OP2 may include the second inside surface S2.

The deposition mask 20 may further include a first first side end BE1, a first second side end UE1, a second first side end BE2, and a second second side end UE2. The first first side end BE1 may denote a portion where the first surface 20*a* of the deposition mask 20 and the first inside surface S1 meet, and the first second side end UE1 may denote a portion where the second surface 20*b* of the deposition mask 20 and the first inside surface S1 meet. The second first side end BE2 may denote a portion where the first surface 20*a* of the deposition mask 20 and the second inside surface S2 meet, and the second second side end UE2 may denote a portion where the second surface 20*b* of the deposition mask 20 and the second inside surface S2 meet.

The openings OP1 and OP2 of the deposition mask 20 may differ in shape in a plan view. The openings OP1 and OP2 of the deposition mask 20 may have two or more different kinds of shapes in a plan view. The deposition mask 20 may include two or more openings OP1 and OP2 that differ in shape in a plan view. The deposition mask 20 may include the first openings OP1 and the second openings OP2 that differ in shape in a plan view.

The first first side end BE1 may be surrounded by the first second side end UE1 in a plan view, and the shape of the first first side BE1 and the shape of the first second side end UE1 may correspond to each other in a plan view. The second first side end BE2 may be surrounded by the second second side end UE2 in a plan view, and the shape of the second first side end BE2 and the shape of the second second side end UE2 may correspond to each other in a plan view. That is, the first first side end BE1 and the second first side end BE2 may differ in shape in a plan view, and the first second side end UE1 and the second second side end UE2 may differ in shape in a plan view.

In an embodiment, the first and second openings OP1 and OP2 may be spaced apart from each other and alternately arranged along the first and second directions DR1 and DR2. That is, in an embodiment, the first and second openings OP1 and OP2 may be alternately arranged in a repetitive manner in the first direction DR1, and the first and second openings OP1 and OP2 may be alternately arranged in a repetitive manner in the second direction DR2.

In an embodiment, at least a part of the plurality of first openings OP1 may be arranged in a state of being rotated in a range greater than 0 degrees and less than 360 degrees in a clockwise direction in a plan view. In another embodiment, at least a part of the plurality of first openings OP1 may be arranged to be (in the drawings) reversed left and right in the first direction DR1 or up and down in the second direction DR2. Likewise, in an embodiment, at least a part of the plurality of second openings OP2 may be arranged in a state of being rotated in a range greater than 0 degrees and less than 360 degrees in the clockwise direction in a plan view. In another embodiment, at least a part of the plurality of second openings OP2 may be arranged to be (in the drawings) reversed left and right in the first direction DR1 or up and down in the second direction DR2.

The deposition mask 20 may further include an opening group GR. In an embodiment, the opening group GR may include one first opening OP1 and one second opening OP2, but the present disclosure is not limited thereto. That is, the deposition mask 20 may include the first and second openings OP1 and OP2 that are repeatedly arranged, and may include the opening groups GR, each including one first opening OP1 and one second opening OP2.

The opening groups GR may be repeatedly arranged along the first and second directions DR1 and DR2. In an embodiment, a part of the opening groups GR may be arranged in a state of being rotated in a range greater than 0 degrees and less than 360 degrees in the clockwise direction in a plan view. In another embodiment, a part of the opening groups GR may be arranged to be (in the drawings) reversed left and right in the first direction DR1 or up and down in the second direction DR2.

Although it is shown in FIGS. 2 and 3 that the openings OP1 and OP2 have example shapes in plan and cross-sectional views, the shapes thereof are not limited thereto.

Figure 4:
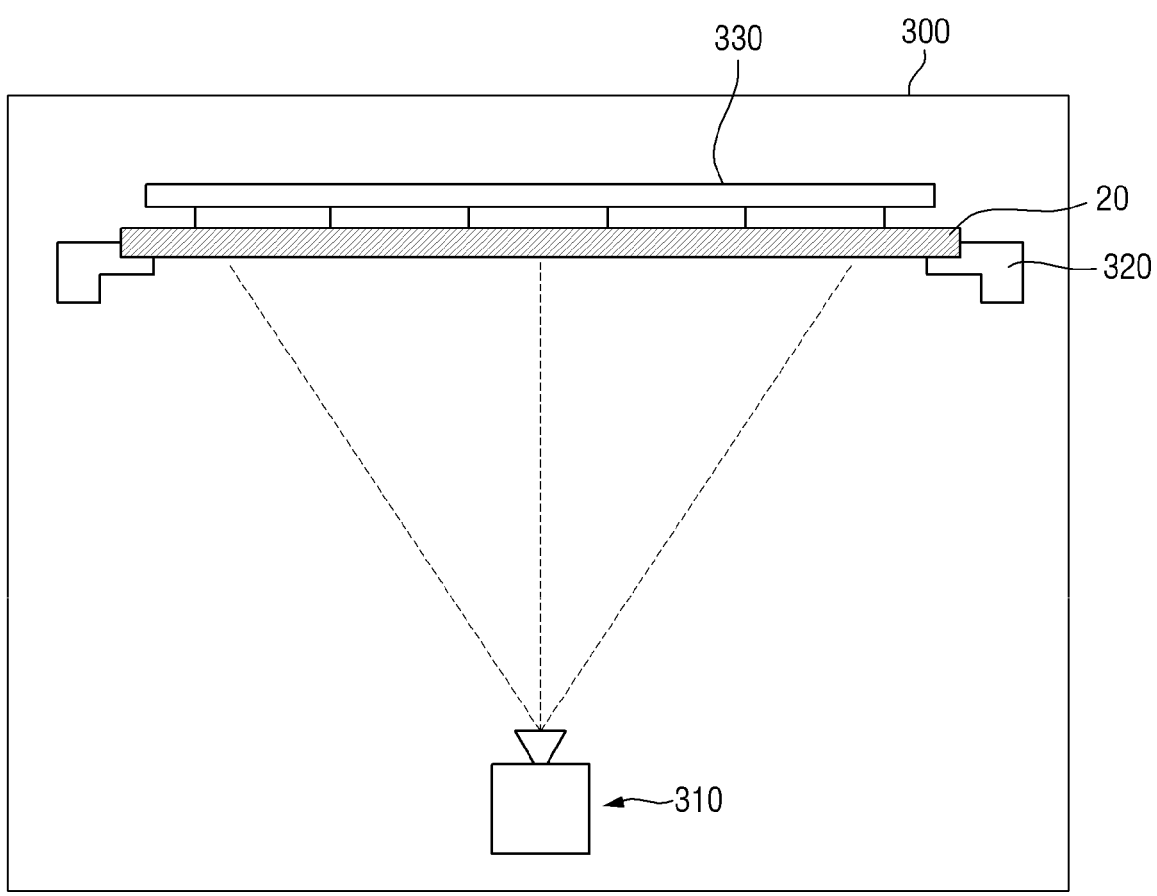
FIG. 4 is a view schematically illustrating a deposition process using the deposition mask of FIGS. 2 and 3.

FIG. 4 is a view schematically illustrating a deposition process using the deposition mask of FIGS. 2 and 3.

Referring to FIG. 4, according to an embodiment, a process of depositing an electrode or an organic light emitting layer of an organic light emitting display device may be performed in a vacuum chamber 300.

A deposition source 310 may be disposed at a lower portion inside the vacuum chamber 300. The deposition source 310 may be, for example, a crucible as a container in which a deposition material is contained. The deposition mask 20 according to an embodiment may be placed on a supporting structure 320 at an upper portion inside the vacuum chamber 300 that faces the deposition source 310. In an embodiment, the target substrate 330, e.g., the target substrate 330 for manufacturing an organic light emitting display device, may be arranged on the deposition mask 20. In an embodiment, the deposition mask 20 and the target substrate 330 may be in direct contact with each other.

When the deposition source 310 evaporates the deposition material onto the deposition mask 20 inside the aforementioned vacuum chamber 300, the deposition material may be deposited on parts of the target substrate 330 that are exposed through the openings OP1 and OP2 (see FIGS. 2 and 3) formed in the deposition mask 20 according to the shapes of the pattern.

Figure 5:
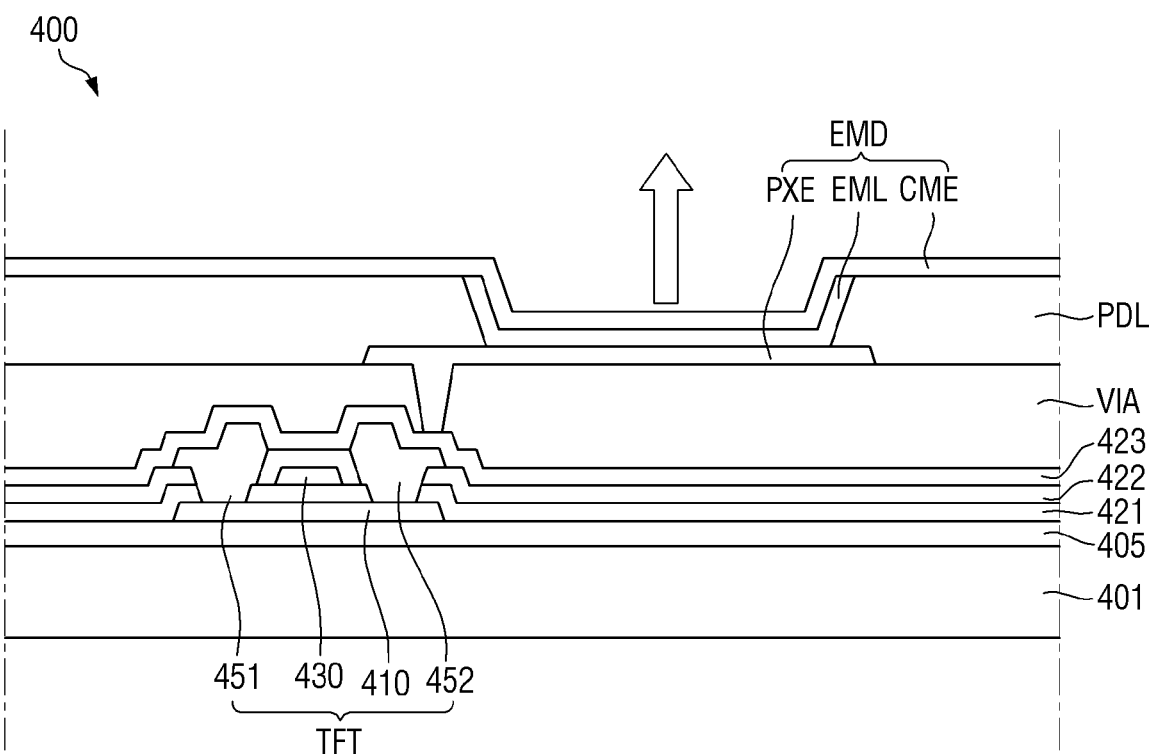
FIG. 5 is a cross-sectional view schematically illustrating an organic light emitting display device manufactured with a deposition mask.

FIG. 5 is a cross-sectional view schematically illustrating an organic light emitting display device manufactured with a deposition mask.

Referring to FIG. 5, a display device 400 may include a base substrate 401. The base substrate 401 may support components stacked on the base substrate 401. The base substrate 401 may be an insulating substrate. In an embodiment, the base substrate 401 may include a transparent material.

A buffer layer 405 may be disposed on the base substrate 401. The buffer layer 405 may be disposed on a surface of the base substrate 401 to protect a thin film transistor TFT and a light emitting element EMD from moisture penetrating through the base substrate 401 susceptible to moisture permeation.

The thin film transistor TFT may be disposed as a driving element on the buffer layer 405. The thin film transistor TFT may include a semiconductor layer 410, a first insulating layer 421, a second insulating layer 422, and a gate electrode 430.

The semiconductor layer 410 of the thin film transistor TFT may be disposed on the buffer layer 405. In an embodiment, the semiconductor layer 410 may include polycrystalline silicon, monocrystalline silicon, low-temperature polycrystalline silicon, amorphous silicon, or an oxide semiconductor.

The first insulating layer 421 may be disposed on the semiconductor layer 410. The first insulating layer 421 may be formed of an inorganic layer.

The gate electrode 430 may be disposed on the first insulating layer 421. The gate electrode 430 may overlap the semiconductor layer 410. In an embodiment, the gate electrode 430 may be formed as a single layer or multiple layers made of any of molybdenum (Mo), aluminum (Al), chromium (Cr), gold (Au), titanium (Ti), nickel (Ni), neodymium (Nd), and copper (Cu), or an alloy thereof.

The second insulating layer 422 may be disposed on the gate electrode 430. The second insulating layer 422 may be formed of an inorganic layer.

A source electrode 451 (or a drain electrode) and a drain electrode 452 (or a source electrode) of the thin film transistor TFT may be disposed on the second insulating layer 422. The source electrode 451 and the drain electrode 452 may be connected to the semiconductor layer 410 through contact holes penetrating the second insulating layer 422 and the first insulating layer 421.

A third insulating layer 423 may be disposed on the source electrode 451 and the drain electrode 452. The third insulating layer 423 may be a passivation layer protecting the thin film transistor TFT therebelow. The third insulating layer 423 may be formed of an inorganic layer.

A via layer VIA may be disposed on the third insulating layer 423. The via layer VIA may be a planarization layer for flattening a step due to the thin film transistor TFT. The via layer VIA may include an organic insulating material.

The light emitting element EMD may be disposed on the via layer VIA. The light emitting element EMD may include a pixel electrode PXE, a light emitting layer EML, and a common electrode CME.

The pixel electrode PXE may be disposed on the via layer VIA. The pixel electrode PXE may be a first electrode (e.g., an anode electrode) of the light emitting element EMD. The pixel electrode PXE may be connected to the drain electrode 452 (or the source electrode) of the thin film transistor TFT through a contact hole penetrating the via layer VIA.

A pixel defining layer PDL may be disposed on the pixel electrode PXE. The pixel defining layer PDL may be disposed on the pixel electrode PXE and may include an opening to expose the pixel electrode PXE. The pixel defining layer PDL may include an organic insulating material.

The light emitting layer EML may be disposed on the pixel electrode PXE exposed by the pixel defining layer PDL. The light emitting layer EML may include an organic material layer. The organic material layer of the light emitting layer EML may include an organic light emitting layer, and may further include a hole injecting/transporting layer and/or an electron injecting/transporting layer.

The common electrode CME may be disposed on the light emitting layer EML. The common electrode CME may be a second electrode (e.g., a cathode electrode) of the light emitting element EMD. In an embodiment, the common electrode CME may be formed commonly to the pixels.

Although per-pixel or per-sub-pixel light emitting elements EMD may be arranged in different shapes in a plan view, if the deposition mask 20 has the corresponding shapes, the per-pixel or per-sub-pixel light emitting elements EMD may be deposited as parts of a common layer at one time.

In addition, the mask inspection apparatus 10 (see FIG. 1) according to an embodiment may inspect the deposition mask 20 for any defect even when the deposition mask 20 includes two or more openings OP1 and OP2 that differ in shape from each other in a plan view. Herein, a mask inspection method according to an embodiment is further described.

Figure 6:
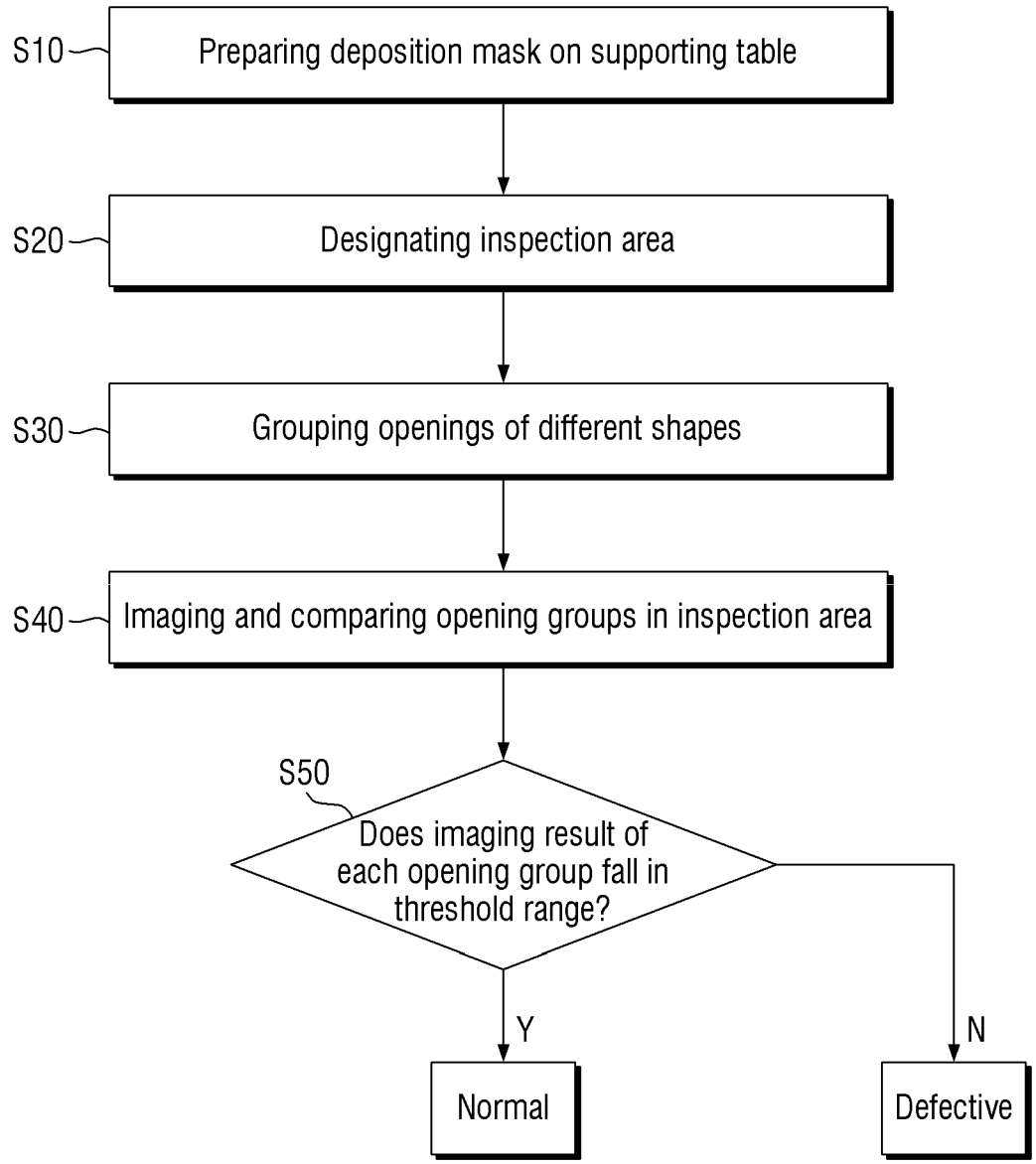
FIG. 6 is a flowchart illustrating a mask inspection method according to an embodiment.
Figure 7:
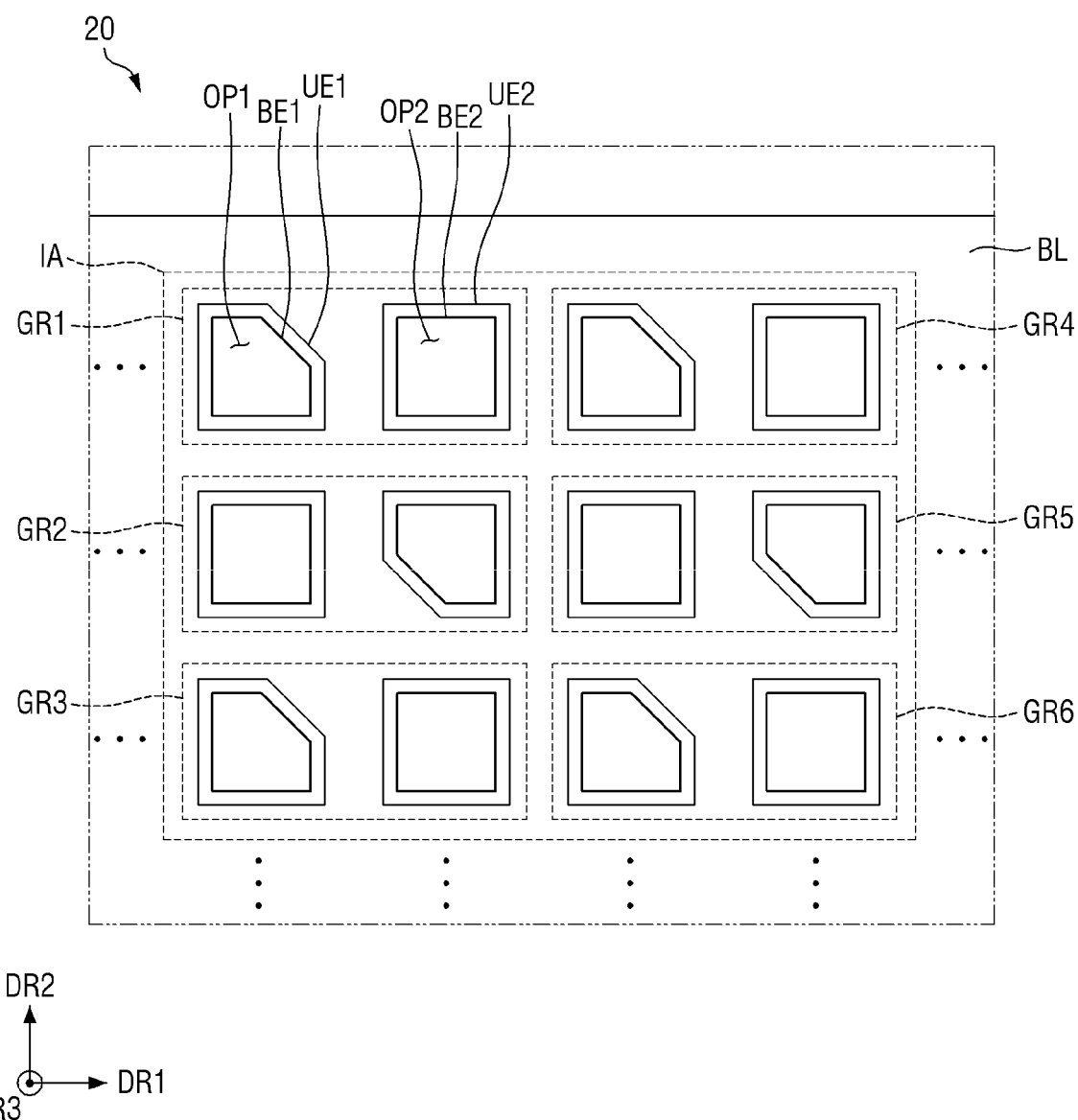
FIG. 7 is a plan view schematically illustrating a mask inspection method according to an embodiment.

FIG. 6 is a flowchart illustrating a mask inspection method according to an embodiment; and FIG. 7 is a plan view schematically illustrating a mask inspection method according to an embodiment.

Referring to FIGS. 1, 6, and 7, first, the deposition mask 20 having the openings OP1 and OP2 that differ in shape is prepared or provided (S10).

The deposition mask 20 may be substantially the same as the deposition mask 20 described with reference to FIGS. 2 and 3, and placed at a location corresponding to an area (e.g., a predetermined area) on the supporting table 110 of the mask inspection apparatus 10 of FIG. 1. The deposition mask 20 may be moved during the process of inspecting the deposition mask 20 by the mask inspection apparatus 10. The deposition mask 20 may be moved onto the supporting table 110 by a component independent of the supporting table 110 or fixed on the supporting table 110 to be moved along with the supporting table 110.

Next, an inspection area IA of the deposition mask 20 is designated (S20).

The inspection area IA may include the plurality of openings OP1 and OP2. In an embodiment, the openings OP1 and OP2 within the inspection area IA may be repeatedly arranged in a pattern (e.g., a predetermined pattern). In an embodiment, the first openings OP1 and the second openings OP2 may be repeatedly arranged in an alternating manner along the first direction DR1, and the first openings OP1 and the second openings OP2 may be repeatedly arranged in an alternating manner along the second direction DR2. Although not limited to the following, adjacent openings, among the openings OP1 and OP2, which are arranged within the inspection area IA may differ in shape. That is, the first and second openings OP1 and OP2 that differ in shape may be repeatedly arranged in an alternating manner, and may be disposed adjacent to each other.

The inspection area IA may include at least a part of an area that can be imaged at one time by the above-described vision unit 120. That is, in a case in which the vision unit 120 includes a CCD sensor, the inspection area IA may include at least a part of the image capture area that can be imaged by the CCD sensor.

Although it is shown that twelve openings OP1 and OP2 are arranged within the inspection area IA, the number of the openings OP1 and OP2 being arranged within the inspection area IA may be greater or less than twelve. In an embodiment, task S20 of designating the inspection area IA may be omitted.

Next, some of the repetitive openings OP1 and OP2 are grouped into the opening groups GR1 to GR6 (S30).

The openings OP 1 and OP2 arranged within the inspection area IA may be grouped by at least two adjacent openings OP1 and OP2 to form each opening group GR. The adjacent first and second openings OP1 and OP2 may, for example, be grouped into the respective groups GR1 to GR6, although not limited thereto. In an embodiment, the opening groups GR1 to GR6 may include the same number of the openings OP1 and OP2, and may include the same number of the first openings OP1 and the same number of the second openings OP2. In addition, the openings OP1 and OP2 belonging to the respective opening groups GR1 to GR6 may be substantially the same in arrangement (or deployment).

In an embodiment, the individual opening groups GR1 to GR6 may be arranged repeatedly within the inspection area IA. That is, the opening groups GR1 to GR6 may be repeatedly arranged along the first and second directions DR1 and DR2 within the inspection area IA.

In an embodiment, the opening groups GR1 to GR6 may each be the smallest unit of repetition within the inspection area IA. The inspection area IA may have the first and second openings OP1 and OP2 disposed therein, and the first and second openings OP1 and OP2 may be arranged in a repetitive manner. In this case, the opening groups GR1 to GR6 may each include one first opening OP1 and one second opening OP2, and the opening groups GR1 to GR6 may be arranged in a repetitive manner within the inspection area IA. The total number of the openings OP1 and OP2 belonging to each of the opening groups GR1 to GR6 may be equal to the sum of the number of the first openings OP1 and the number of the second openings OP2 included in each of the opening groups GR1 to GR6.

The openings OP1 and OP2 arranged within the inspection area IA may differ in shape, and the opening groups GR1 to GR6 arranged within the inspection area IA may be the same in shape. That is, the opening groups GR1 to GR6 may each include the first and second openings OP1 and OP2 in the same manner, and some opening groups GR2 and GR5 among the opening groups GR1 to GR6 may be arranged in a state of being rotated by an angle (e.g., a predetermined angle) in the horizontal direction (or about an axis extending in the thickness direction (third direction DR3)). Although it is shown in the drawing that some opening groups GR2 and GR5 are rotated by 180 degrees, the rotation angle is not limited thereto.

In an embodiment, each of the opening groups GR1 to GR6 is the smallest unit of repetition within the inspection area IA, and may also be the smallest unit for inspecting the openings OP1 and OP2 of the deposition mask 20 for any defect. That is, the first and second openings OP1 and OP2 that differ in shape are grouped into each of the opening groups GR1 to GR6 to inspect the openings for any defect by one unit of each of the opening groups GR1 to GR6, which may facilitate inspecting the openings of the deposition mask 20 for any defect even though the openings OP1 and OP2 of the deposition mask 20 differ in shape.

Next, the opening groups GR1 to GR6 arranged within the inspection area IA are imaged and compared (S40), and it is determined whether or not the imaging result falls in a threshold range (S50). As a result, it is determined whether the openings OP1 and OP2 arranged in the deposition mask 20 are normal or defective.

The opening groups GR1 to GR6 arranged within the inspection area IA are imaged by the vision unit 120 to be compared with one another. Comparing the opening groups GR1 to GR6 may be carried out by comparing the images obtained by imaging the opening groups GR1 to GR6 with one another. By comparing the areas of the opening groups GR1 to GR6, it may be possible to identify an opening group including a defective opening among the opening groups GR1 to GR6.

In a case in which the vision unit 120 captures an image of the opening groups GR1 to GR6 with the CCD sensor, pixels of the CCD sensor may be arranged within the openings OP1 and OP2 of the opening groups GR1 to GR6 on the captured image. The pixels of the CCD sensor of the vision unit 120 may be arranged at regular intervals such that the areas of the openings OP1 and OP2 of the opening groups GR1 to GR6 may be compared using the numbers of the pixels of the CCD sensor, which are arranged in the openings OP1 and OP2.

The pixels of the CCD sensor may be located at the first side ends BE1 and BE2 of the respective openings OP1 and OP2 and/or at the second side ends UE1 and UE2 of the respective openings OP1 and OP2. That is, when determining whether the openings OP1 and OP2 are defective, at least one of the pixels of the CCD sensor that are located at the first side ends BE1 and BE2 of the respective openings OP1 and OP2 and the pixels of the CCD sensor that are located at the second side ends UE1 and UE2 of the respective openings OP1 and OP2 may be used as a defect determination standard.

Among the openings OP1 and OP2 of the individual opening groups GR1 to GR6 arranged within the inspection area IA, qualified openings OP1 and OP2 may include the pixels of the CCD sensor of which the number falls in a certain range (e.g., a predetermined range), and the defective openings OP1 and OP2 may include the pixels of the CCD sensor of which the number falls outside of the certain range (e.g., the predetermined range). That is, it may be possible to compare the openings OP1 and OP2 of the respective opening groups GR1 to GR6 arranged within the inspection area IA by opening group to determine the openings OP1 and OP2 including the pixels of the CCD sensor of which the number falls in the certain range (e.g., the predetermined range) as qualified (normal) and the openings OP1 and OP2 including the pixels of the CCD sensors of which the number falls outside of the certain range (e.g., the predetermined range) as defective.

It may also be possible to identify an opening group including a defective opening among the opening groups GR1 to GR6 by comparing the shapes of the openings OP1 and OP2 of the respective opening groups GR1 to GR6.

The pixels of the CCD sensor may be arranged according to the edge shapes of the openings OP1 and OP2 among the openings OP1 and OP2 of the respective opening groups GR1 to GR6 arranged within the inspection area IA. On the basis of the number of pixels of the CCD sensor that are arranged on each edge, it may be possible to compare the lengths of the edges of the openings OP1 and OP2 of the respective opening groups GR1 to GR6 with one another and compare the shapes of the openings OP1 and OP2 of the respective opening groups GR1 to GR6 with one another. The edges of the openings OP1 and OP2 may correspond to at least one of the first side ends BE1 and BE2 and/or the second side ends UE1 and UE2 of the openings OP1 and OP2.

For example, it may be possible to compare with one another the lengths of the edges of the first and second openings OP1 and OP2 of the respective opening groups GR1 to GR6, extending in the first direction DR1, the lengths of the edges thereof extending in the second direction DR2, and/or the lengths of the edges thereof extending in a direction inclined with respect to the first and second directions DR1 and DR2. It may be possible to compare with one another the shapes of the first and second openings OP1 and OP2 of the respective opening groups GR1 to GR6 based on the lengths or the like.

That is, whether the openings OP1 and OP2 are defective may be determined by comparing the shapes of the openings OP1 and OP2 of the respective opening groups GR1 to GR6 in the inspection area IA with one another between the opening groups GR1 to GR6. In this case, it may be possible to determine the openings OP1 and OP2 having shapes falling within a threshold range as qualified (normal) and the openings OP1 and OP2 having shapes falling outside of the threshold range as defective.

In an embodiment, the openings OP1 and OP2 of the respective opening groups GR1 to GR6 may be compared with one another in consideration of some of the opening groups GR1 to GR6 being rotated in the horizontal direction. For example, some opening groups GR2 and GR5, among the opening groups GR1 to GR6, may be arranged in the state of being rotated by 180 degrees in the horizontal direction in comparison with the remaining opening groups GR1, GR3, GR4, and GR6, and, in the case of comparing the openings OP1 and OP2 of the respective opening groups GR1 to GR6, the comparison of the openings OP1 and OP2 may be carried out in consideration of the 180 degree rotation of opening groups GR2 and GR5 in the horizontal direction. That is, the openings OP1 and OP2 of the respective opening groups GR1 to GR6 may be compared with one another in a state in which the opening groups GR2 and GR5 are rotated by 180 degrees in a reverse direction of the rotation direction. In this manner, even though some of the opening groups GR1 to GR6 are rotated by a certain angle (e.g., a predetermined angle) in the horizontal direction, it may be possible to more accurately determine whether the openings OP1 and OP2 of the respective opening groups GR1 to GR6 are defective.

In an embodiment, in the case of comparing the areas and/or shapes of the openings OP1 and OP2 of the respective opening groups GR1 to GR6, first of all, an inspector may compare with one another the areas and/or shapes of the openings OP1 and OP2 of the respective opening groups GR1 to GR6 based on the image captured by the vision unit 120 with the naked eyes. A defect determination may be made based on a result of the comparison. That is, the inspector may first inspect the openings OP1 and OP2 of the neighboring opening groups GR1 to GR6 for defective ones different in area and/or shape from others with the naked eyes. However, the present disclosure is not limited thereto, and, in an embodiment, the defective product detection process with the inspector's naked eyes may be omitted.

Although the above description has been directed to the case of first grouping the openings OP1 and OP2 that differ in shape at task S30 and imaging and comparing the groups at task S40, the order is not limited thereto, and it may be possible to first capture an image of the inspection area IA at task S40, group the openings OP1 and OP2 that differ in shape on the captured image at task S30, compare them, and make a defect determination at task S50.

Although it has been described that the openings OP1 and OP2 of the respective opening groups GR1 to GR6 within the inspection area IA are compared with one another to make a defective opening determination, the present disclosure is not limited thereto. The defective opening determination may be made in such a way of comparing the openings OP1 and OP2 of the respective opening groups GR1 to GR6 with the reference image generated based on the plan data used in forming the deposition mask 20. In this case, the mask inspection method may further include a step of acquiring the reference image, and the arrangement (or deployment) of the openings OP1 and OP2 of the respective opening groups GR1 to GR6 may be substantially the same as the arrangement (or deployment) of the openings included in the reference image.

Herein, some other example embodiments will be described. In the following embodiments, a description of the same components as those of the above-described embodiment may be omitted or simplified, and differences will be mainly described.

Figure 8:
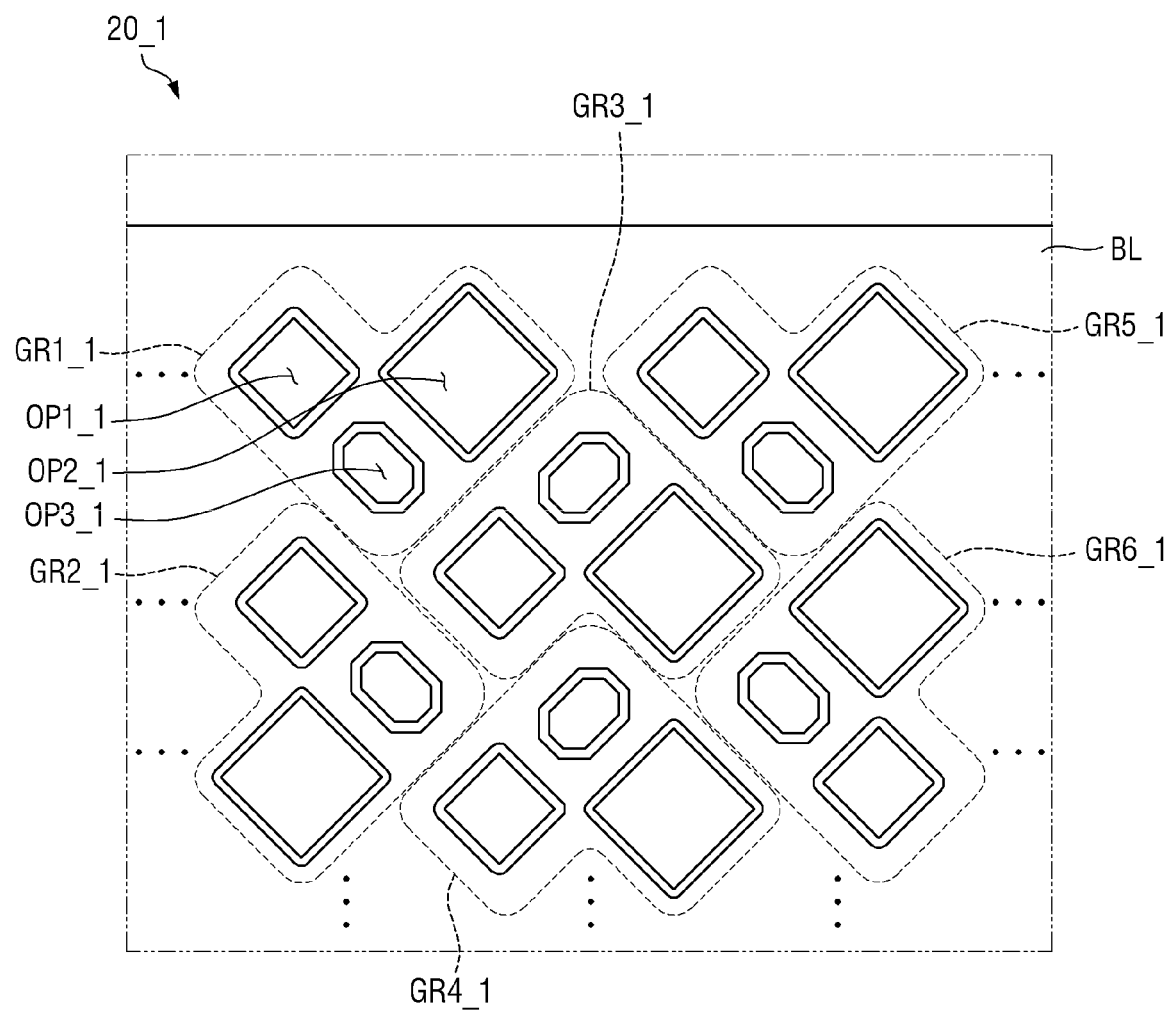
FIG. 8 is a plan view schematically illustrating a mask inspection method according to another embodiment.

FIG. 8 is a plan view schematically illustrating a mask inspection method according to another embodiment.

Referring to FIG. 8, the mask inspection method according to another embodiment differs from that of the embodiment of FIG. 7 in that each of opening groups GR1_1, GR2_1, GR3_1, GR4_1, GR5_1, and GR6_1 includes three openings OP1_1, OP2_1, and OP3_1 that differ in shape.

In further detail, a deposition mask 20_1 according to an embodiment may include an inspection area, and a plurality of opening groups GR1_1, GR2_1, GR3_1, GR4_1, GR5_1, and GR6_1 may be arranged in the inspection area. The opening groups GR1_1, GR2_1, GR3_1, GR4_1, GR5_1, and GR6_1 may each include three openings OP1_1, OP2_1, and OP3_1 that differ in shape.

In an embodiment, the opening groups GR1_1, GR2_1, GR3_1, GR4_1, GR5_1, and GR6_1 may be repeatedly arranged outside as well as inside the inspection area, and the openings OP1_1, OP2_1, and OP3_1 of the respective opening groups GR1_1, GR2_1, GR3_1, GR4_1, GR5_1, and GR6_1 may be repeatedly arranged. The openings OP1_1, OP2_1, and OP3_1 may be disposed adjacent to each other.

Even in this case, it may be possible to inspect the deposition mask 20_1 for any defect even though the openings OP1_1, OP2_1, and OP3_1 arranged in the deposition mask 20_1 differ in shape in a plan view.

Figure 9:
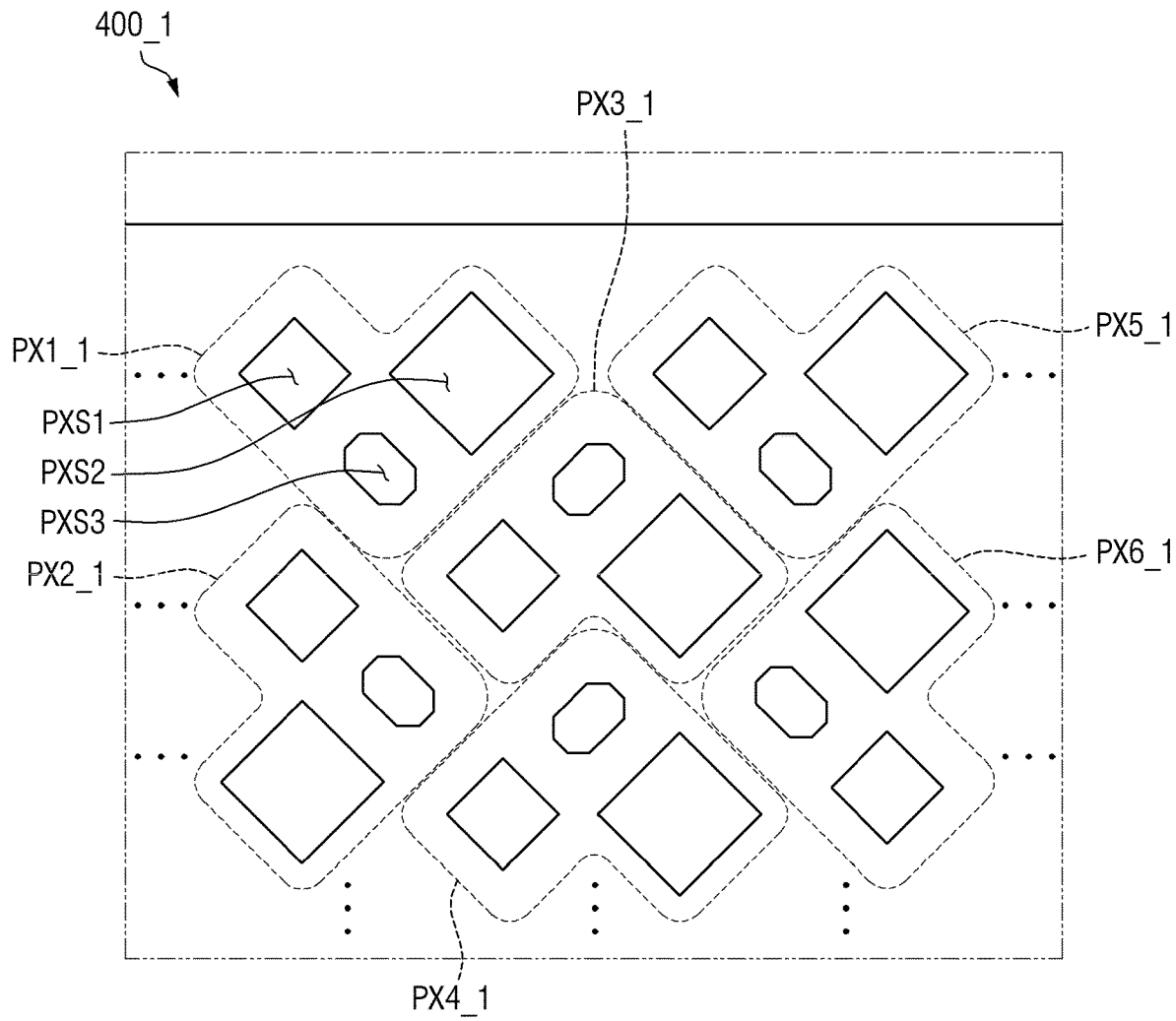
FIG. 9 is schematic layout view illustrating a pixel arrangement of a display device according to another embodiment.

FIG. 9 is schematic layout view illustrating a pixel arrangement of a display device according to another embodiment. FIG. 9 shows an example of a display device 400_1 that may be manufactured with the deposition mask 20_1 of FIG. 8.

Referring to FIG. 9, the display device 400_1 may include a plurality of pixels. The pixel represents the smallest unit of repetition for display. In order to achieve full-color display, each pixel may include a plurality of sub-pixels PXS1, PXS2, and PXS3 emitting different colors. In an embodiment, for example, each pixel may include a first sub-pixel PXS1 responsible for red light emission, a second sub-pixel PXS2 responsible for green light emission, and a third sub-pixel PXS3 responsible for blue light emission. In an embodiment, each pixel PX may be provided with one first sub-pixel PXS1, one second sub-pixel PXS2, and one third sub-pixel PXS3. The first sub-pixel PXS1, the second sub-pixel PXS2, and the third sub-pixel PXS3 may differ in shape in a plan view. Even in this case, a common layer that is commonly arranged on the light emitting elements EMD (see FIG. 5) of the sub-pixels PXS1, PXS2, and PXS3 may be deposited at one time.

Figure 10:
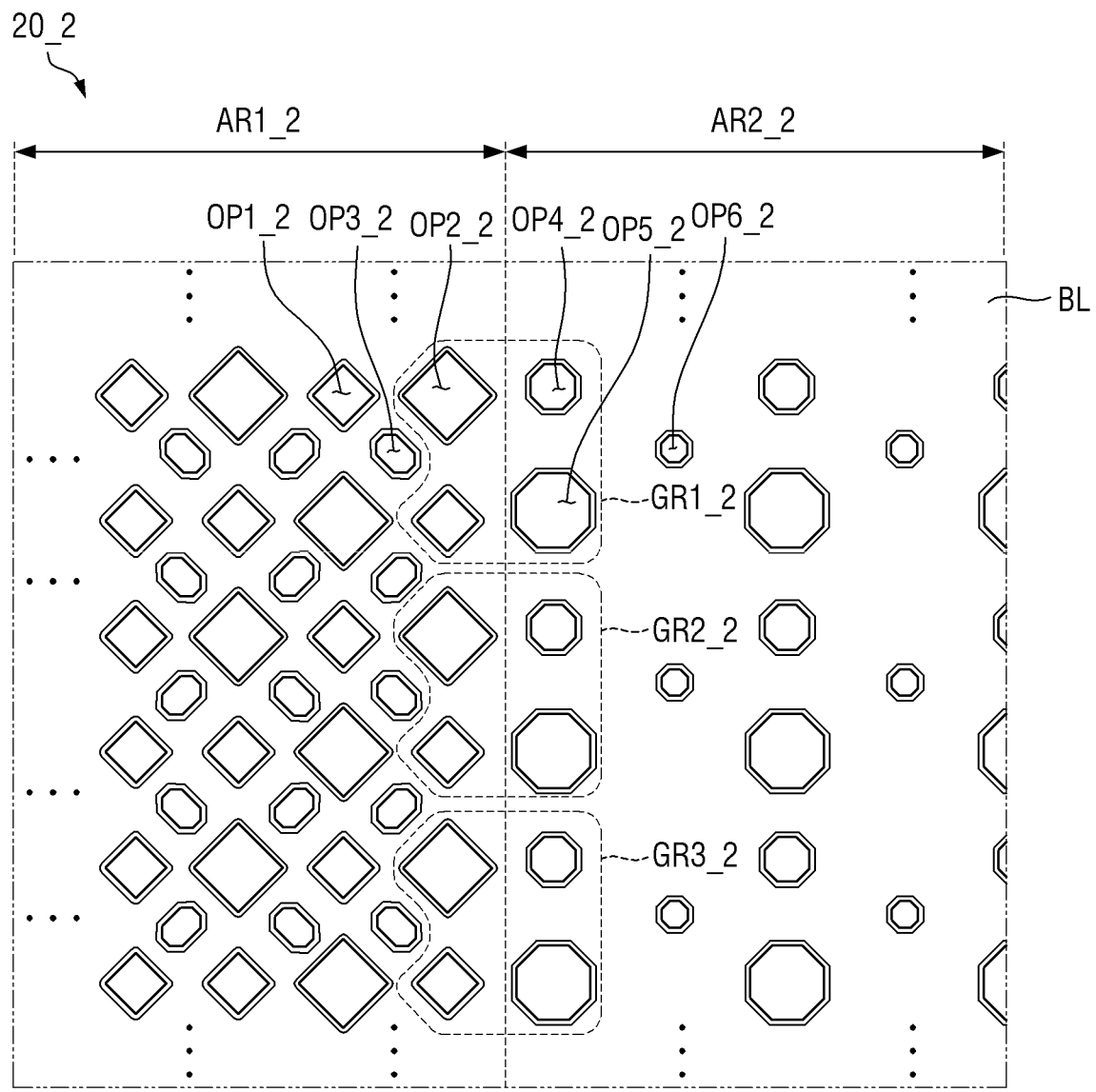
FIG. 10 is a plan view schematically illustrating a mask inspection method according to another embodiment.

FIG. 10 is a plan view schematically illustrating a mask inspection method according to another embodiment.

Referring to FIG. 10, the mask inspection method according to another embodiment differs from that according to the embodiment of FIG. 7 in that each of opening groups GR1_2, GR2_2, and GR3_2 includes openings OP1_2, OP2_2, OP4_2, and OP5_2 that belong to different areas.

In further detail, a deposition mask 20_2 according to this embodiment may include two areas AR1_2 and AR2_2 that differ in opening arrangement patterns. A first area AR1_2 may include first to third openings OP1_2, OP2_2, and OP3_2, and the first to third openings OP1_2, OP2_2, and OP3_2 may differ in shape in a plan view. A second area AR2_2 may include fourth to sixth openings OP4_2, OP5_2, and OP6_2, and the fourth to sixth openings OP4_2, OP5_2, and OP6_2 may differ in shape and/or size in a plan view. In addition, the first to third openings OP1_2, OP2_2, and OP3_2 and the fourth to sixth openings OP4_2, OP5_2, and OP6_2 may differ in shape and/or size.

The arrangement pattern of the first to third openings OP1_2, OP2_2, and OP3_2 in the first area AR1_2 and the arrangement pattern of the fourth to sixth openings OP4_2, OP5_2, and OP6_2 in the second area AR2_2 may differ from each other. In addition, although it will be described later, the first to third openings OP1_2, OP2_2, and OP3_2 in the first area AR1_2 may be substantially the same in function with the respective fourth to sixth openings OP4_2, OP5_2, and OP6_2 in the second area AR2_2. That is, the first opening OP1_2 of the first area AR1_2 and the fourth opening OP4_2 of the second area AR2_2 that differ in shape and/or size may be used to form the pixels emitting the same color (e.g., red) light. The second opening OP2_2 of the first area AR1_2 and the fifth opening OP5_2 of the second area AR2_2 that differ in shape and/or size may be used to form the pixels emitting the same color (e.g., blue) light. The third opening OP3_2 of the first area AR1_2 and the sixth opening OP6_2 of the second area AR2_2 that differ in shape and/or size may be used to form the pixels emitting the same color (e.g., green) light.

Around the boundary between the first and second areas AR1_2 and AR2_2, the opening groups GR1_2, GR2_2, and GR3_2 may each include at least one of the first to third openings OP1_2, OP2_2, and OP3_2 and at least one of the fourth to sixth openings OP4_2, OP5_2, and OP6_2. For example, the opening groups GR1_2, GR2_2, and GR3_2 may each include, around the boundary, the first and second openings OP1_2 and OP2_2 of the first area AR1_2 and the fourth and fifth openings OP4_2 and OP5_2 of the second area AR2_2.

In this case, it may be possible to inspect the openings OP1_2, OP2_2, OP4_2, and OP5_2 included in each of the opening groups GR1_2, GR2_2, and GR3_2 for any defect by comparing the opening groups GR1_2, GR2_2, and GR3_2 with one another. In addition, an inspection of the first to third openings OP1_2, OP2_2, and OP3_2 of the first area AR1_2 and an inspection of the fourth to sixth openings OP4_2, OP5_2, and OP6_2 of the second area AR2_2 may be performed respectively before or after the above inspection. In an embodiment, the inspection in the first area AR1_2 and the inspection in the second area AR2_2 may be performed by applying the same above-described inspection method.

Because each of the opening groups GR1_2, GR2_2, GR3_2, as the smallest unit of mask inspection, includes at least a part of the openings OP1_2, OP2_2, OP3_2, OP4_2, OP5_2, and OP6_2 included in the respective areas AR1_2 and AR2_2 around the boundary between the areas AR1_2 and AR2_2, it may be possible to more precisely inspect the deposition mask 20_2 for any defect even though the deposition mask 20_2 includes the plurality of areas AR1_2 and AR2_2 with different opening arrangement patterns. That is, some openings OP1_2, OP2_2, OP4_2, and OP5_2 adjacent to the boundary between the first and second areas AR1_2 and AR2_2 may be inspected for any defect using the above-described method even though they do not belong to any group during the inspection of the first area AR1_2 and the inspection of the second area AR2_2.

In this case, even though the openings OP1_2, OP2_2, OP3_2, OP4_2, OP5_2, and OP6_2 arranged in the deposition mask 20_2 differ in shape in a plan view and belong to two different areas AR1_2 and AR2_2, it may be possible to inspect the deposition mask 20_2 for any defect.

Figure 11:
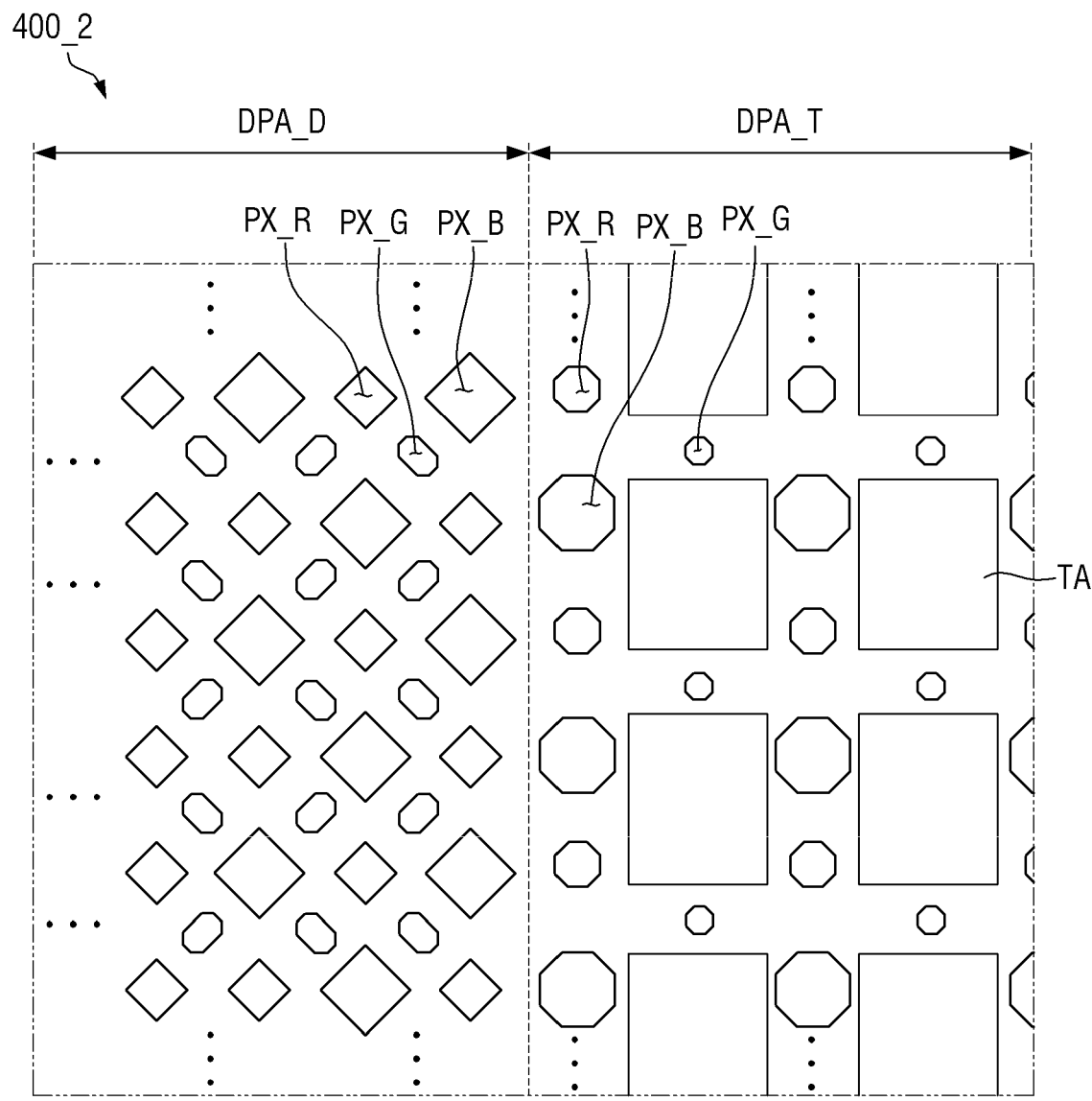
FIG. 11 is a schematic layout view illustrating a pixel arrangement of a display device according to another embodiment.

FIG. 11 is a schematic layout view illustrating a pixel arrangement of a display device according to another embodiment. FIG. 11 shows an example of a display device 400_2 that can be manufactured with the deposition mask 20_2 of FIG. 10.

Referring to FIG. 11, the display device 400_2 may be divided into a first display area and a second display area depending on whether light transmitting portions TA are included. For example, the display device 400_2 may include a dedicated display area DPA_D as a first display area and a light transmitting display area DPA_T as a second display area. The dedicated display area DPA_D may correspond to the first area AR1_2 of FIG. 10, and the light transmitting display area DPA_T may correspond to the second area AR2_2 of FIG. 10.

The dedicated display area DPA_D and the light transmitting display area DPA_T include a plurality of pixels PX_R, PX_B, and PX_G including respective emission regions, and display an image through light emission of the emission regions of the pixels PX_R, PX_B, and PX_G. The light transmitting display area DPA_T includes a plurality of light transmitting portions TA in addition to the pixels PX_R, PX_B, and PX_G including the emission regions. The dedicated display area DPA_D includes no light transmitting portion TA. The light transmitting portions TA of the light transmitting display area DPA_T are regions that emit no light on their own and allow light to pass therethrough in the thickness direction.

The light transmitting portions TA of the light transmitting display area DPA_T may be used for any of various purposes. In an embodiment, the light transmitting portions TA of the light transmitting display area DPA_T may be used as a passage for light sensing, although not limited thereto. In an embodiment, although not shown, a light sensing member (not shown) may be arranged below the display device 400_2. The light sensing member (not shown) may be a device that receives light to acquire information or perform a specific function. Examples of the light sensing member may include a camera including photoelectric transformation elements, an infrared proximity sensor, an iris recognition sensor, and a fingerprint sensor. In an embodiment, the light transmitting display area DPA_T may serve as a passage for the light from the outside to reach the light sensing member (not shown) in a state of displaying a video or an image.

Figure 12:
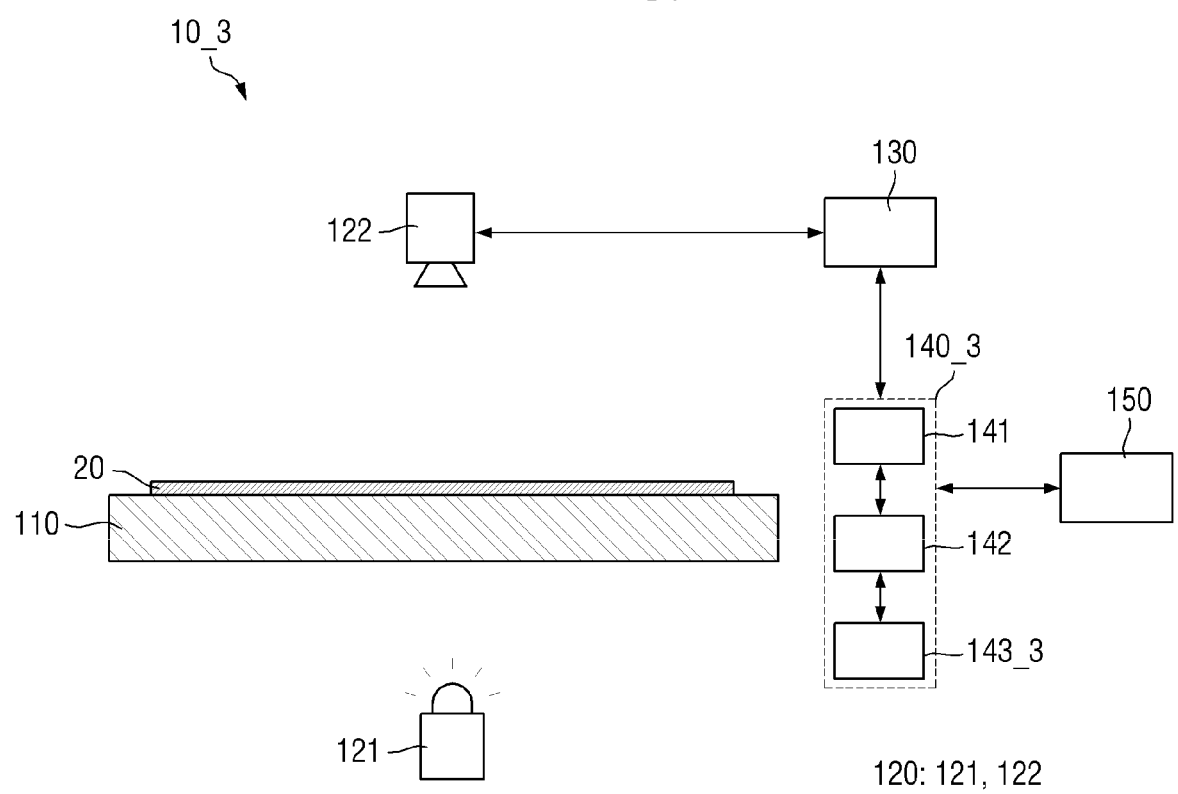
FIG. 12 is a side view schematically illustrating a mask inspection apparatus according to another embodiment.
Figure 13:
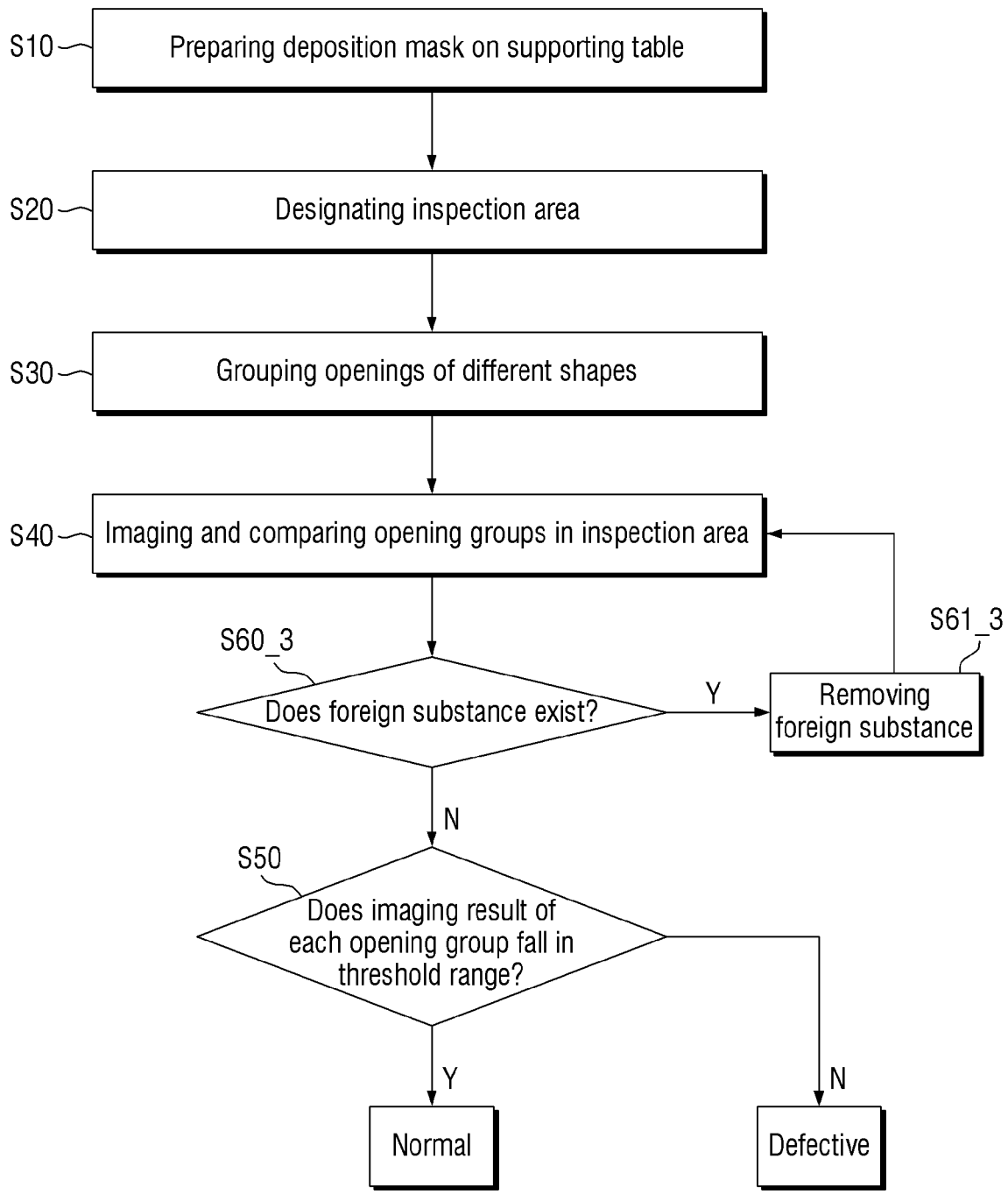
FIG. 13 is a flowchart illustrating a mask inspection method according to another embodiment.

FIG. 12 is a side view schematically illustrating a mask inspection apparatus according to another embodiment; and FIG. 13 is a flowchart illustrating a mask inspection method according to another embodiment.

Referring to FIGS. 12 and 13, a mask inspection apparatus 10_3 according to another embodiment differs from that according to the embodiment of FIG. 1 in that a foreign substance detection unit 143_3 is further included, and the mask inspection method according to this embodiment differs from that according to the embodiment of FIGS. 6 and 7 in that task S60_3 of determining whether a foreign substance exists is further included.

In further detail, the mask inspection apparatus 10_3 according to an embodiment may further include the foreign substance detection unit 143_3 for use in determining whether there is a foreign substance on the deposition mask 20. Whether or not there is a foreign substance may be determined by a controller 140_3, and the controller 140_3 may further include the foreign substance detection unit 143_3.

Task S60_3 of determining whether there is a foreign substance may follow task S40 of imaging and comparing the opening groups GR1 to GR6 (see FIG. 7). It may also be possible to determine whether there is a foreign substance based on image information of the opening groups GR1 to GR6 (see FIG. 7) imaged by the vision unit 120. Although not limited to the following, it may be possible to determine whether there is a foreign substance in consideration of the light reflectivity, surface roughness, or shape in the respective opening groups GR1 to GR6.

At task S60_3 of determining whether there is a foreign substance, if it is determined that there is a foreign substance, the foreign substance may be removed (S61_3). As a method of removing the foreign substance, the foreign substance may be removed, for example, by cleaning, although not limited thereto. After removing the foreign substance at task S61_3, imaging and comparing the opening groups GR1 to GR6 (see FIG. 7) may be performed again (S40).

At task S60_3 of determining whether there is a foreign substance, if it is determined that there is no foreign substance, it is determined whether an imaging result of each of the opening groups GR1 to GR6 (see FIG. 7) falls within a threshold range (S50).

Even in this case, it may be possible to inspect the deposition mask 20 for any defect even though the openings OP1 and OP2 (see FIG. 7) arranged in the deposition mask 20 differ in shape in a plan view. In addition, further inspection for any foreign substance may reduce defects on the deposition mask 20.

Although some example embodiments have been described herein, those skilled in the art will appreciate that many variations and modifications can be made to the example embodiments without substantially departing from the principles of the present disclosure. Therefore, the disclosed embodiments of the invention are provided in a generic and descriptive sense and not for purposes of limitation.

What is claimed is:

1. A mask inspection method comprising:
providing a deposition mask comprising a plurality of first openings and a plurality of second openings, each of the first openings having a same shape in a plan view and different from that of each of the second openings, the deposition mask comprising a first surface and a second surface opposite the first surface, a second side end of each of the first openings located at the second surface surrounding a first side end of the respective first opening located at the first surface, and a second side end of each of the second openings located at the second surface surrounding a first side end of the respective second opening located at the first surface;
designating a first group and a second group, each comprising at least one of the first openings and at least one of the second openings;
comparing an image of the first group with an image of the second group; and
determining whether the first group and the second group are defective based on a result of comparing the image of the first group with the image of the second group,
wherein an arrangement of the first and second openings of the first group is the same as an arrangement of the first and second openings of the second group and rotated in the plan view.

2. The mask inspection method of claim 1, wherein the comparing of the image of the first group and the image of the second group comprises comparing an area of the first group with an area of the second group.

3. The mask inspection method of claim 2, further comprising, before the comparing of the image of the first group and the image of the second group, imaging the first group and the second group by using a vision unit including a charge-coupled device sensor comprising a plurality of pixels to acquire an image of the first group and an image of the second group.

4. The mask inspection method of claim 3, wherein the comparing of the area of the first group and the area of the second group comprises comparing a number of a part of the pixels of the charge-coupled device sensor arranged within the first group with a number of another part of the pixels of the charge-coupled device sensor arranged within the second group.

5. The mask inspection method of claim 1, wherein the comparing of the image of the first group and the image of the second group comprises comparing a shape of the first group with a shape of the second group.

6. The mask inspection method of claim 5, further comprising imaging the first group and the second group by using a vision unit comprising a charge-coupled device sensor comprising a plurality of pixels,
wherein the comparing of the shape of the first group and the shape of the second group comprises comparing a shape of a part of the pixels of the charge-coupled device sensor arranged within the first group with a shape of another part of the pixels of the charge-coupled device sensor arranged within the second group.

7. The mask inspection method of claim 6, wherein the comparing of the image of the first group and the image of the second group further comprises rotating any one of the image of the first group and the image of the second group in a horizontal direction.

8. The mask inspection method of claim 5, wherein the comparing of the image of the first group and the image of the second group comprises comparing with naked eyes of an inspector.

* * * * *